United States Patent [19]

Tanino

[11] Patent Number: 5,072,142

[45] Date of Patent: Dec. 10, 1991

[54] HIGH FREQUENCY FET SWITCH AND DRIVER CIRCUIT

[75] Inventor: Noriyuki Tanino, Itami, Japan

[73] Assignee: Mitsubishi Denki Kabushiki Kaisha, Japan

[21] Appl. No.: 561,977

[22] Filed: Aug. 2, 1990

[30] Foreign Application Priority Data

Dec. 28, 1989 [JP] Japan ................................ 1-342766

[51] Int. Cl.5 ...................... H03K 17/687; H03P 1/10

[52] U.S. Cl. .................................... 307/571; 307/584; 307/296.3; 307/304; 333/104

[58] Field of Search ............... 307/220, 304, 571, 529, 307/296.3, 296.8, 584, 568; 333/157, 101, 103, 104, 108

[56] References Cited

U.S. PATENT DOCUMENTS

| | | | |
|---|---|---|---|
| 4,728,826 | 3/1988 | Einzinger et al. | 307/584 |
| 4,845,389 | 7/1989 | Pyndiah et al. | 307/529 |
| 4,873,460 | 10/1989 | Rippel | 307/584 |
| 4,908,531 | 3/1990 | Podell et al. | 307/571 |
| 4,939,485 | 7/1990 | Eisenberg | 333/104 |

*Primary Examiner*—Stanley D. Miller
*Assistant Examiner*—Richard Roseen
*Attorney, Agent, or Firm*—Leydig, Voit & Mayer

[57] ABSTRACT

A semiconductor integrated circuit includes a first FET for controlling transfer of a high frequency signal, first and second capacitors connected to a gate of the first FET directly or through a resistor or a ¼ wavelength line, a second FET having its drain connected to the first capacitor and its source grounded at high frequencies band, and a third FET having its drain connected to said second capacitor and its source grounded at high frequencies.

6 Claims, 4 Drawing Sheets

HIGH FREQUENCY FET SWITCH AND DRIVER CIRCUIT

FIELD OF THE INVENTION

The present invention relates to a semiconductor integrated circuit, and more particularly, to a semiconductor integrated circuit for a high frequencies such as a microwave.

BACKGROUND OF THE INVENTION

FIG. 4 shows a conventional semiconductor integrated circuit. In FIG. 4, reference numeral Q1 designates a field effect transistor (referred to as FETQ1 hereinafter) and reference numerals T1 and T2 designate microwave lines connected to a source and a drain of the FETQ1, respectively. Reference numerals C5 and C6 designate capacitors connected to the microwave lines T1 and T2, respectively. Reference numeral R1 designates a resistor connected to a gate of the FETQ1, reference numeral C8 designates a capacitor connected to the resistor R1, reference numeral T3 designates a ¼ wavelength line connected to the microwave line T1 and the capacitor C5, and reference numeral C7 designates a capacitor connected to the microwave line T3.

Then, operation thereof will be described. A drive signal input terminal S3 connected to a the connection of the resistor R1 and the capacitor C8 is used to control switching of the FETQ1. In addition, the ¼ wavelength line T3 and the capacitor C7 apply a source voltage bias of the FETQ1, supplied from a power supply terminal V3 connected to the connection of the ¼ wavelength line T3 and the capacitor C7. A high frequency signal is input from Rin and output to Rout. When the drive signal input terminal S3 becomes high, the FETQ1 is turned ON and the high frequency signal input from Rin is output to Rout. When the drive signal input terminal S3 becomes low, the FETQ1 is turned OFF and the high frequency signal input from Rin is not output to Rout.

The resistor R1 is generally set sufficiently higher than the impedance of the microwave lines T1 and T2. Therefore, when the FETQ1 is ON, the high frequency signal is prevented from leaking to the gate side of the FETQ1 through the capacitance Cgs between the gate and source of the FETQ1. In addition, when the mutual conductance Gm of the FETQ1 is fairly high, oscillation is prevented. Furthermore, electrostatic destruction of the gate of the FETQ1 is prevented.

The capacitor C8 and the resistor R1 are a RC low-pass filter circuit the capacitance of the capacitor C8 is set at a large value so as to be sufficiently low impedance to the high frequency signal so that the high frequency signal does not leak from the input terminal S3. In addition, although the resistor R1 is used in the example shown in FIG. 4, a ¼ wavelength line is sometimes used instead of the resistor R1.

Since the conventional semiconductor integrated circuit is structured as described above, a relatively large drive circuit such as a TTL circuit is required in order to control the drive signal input terminal S3, to drive the capacitor C8 and the gate of the FETQ1, with a result that power consumption is increased and a switching speed of the FETQ1 is slow because it is necessary to charge and discharge the capacitor C8.

SUMMARY OF THE INVENTION

The present invention was made to solve the above problem and it is an object of the present invention to provide a semiconductor integrated circuit in which power consumption is reduced and a gate of an FETQ1 can be driven at high speed because charging and discharging of a capacitor C8 is dispensed with.

It is another object of the present invention to provide a semiconductor integrated circuit in which a signal for gate driving can be easily generated by an integrated circuit.

Other objects and advantages of the present invention will become apparent from the detailed description given that the detailed description and specific embodiment are given by way of illustration only, since various changes and modifications within the spirit and scope of the invention will become apparent to those skilled in the art from this detailed description.

A semiconductor integrated circuit in accordance with the present invention comprises a first FET serving as a transfer gate controlling transfer of a high frequency signal, first and second capacitors connected to a gate of the first FET directly or through a resistor or a ¼ wavelength line, a second FET having its drain connected to the first capacitor and its source grounded at high frequencies, and a third FET having its drain connected to the second capacitor and its source grounded at high frequencies.

A semiconductor integrated circuit in accordance with the present invention further comprises a second resistor connected in parallel with the first capacitor, a third resistor connected in parallel with the second capacitor and a fourth resistor having one end connected to the connection of the second and third resistor and the other end held at a fixed potential.

According to the present invention, the first capacitor transfers the high frequency signal through the second FET when the first FET is ON and the second capacitor transfers the high frequency signal through the third FET when the first FET is OFF, so that the high frequency signal is grounded at high frequencies through the first capacitor or the second capacitor in both cases where the first FET is ON or OFF. Therefore, the first and second capacitors play the same role as the capacitor C8 in the prior art. However, this invention is different from the prior art in that the first and second capacitors are electrically floating by the second and third FETs in accordance with the ON or OFF state of the first FET, so that charging and discharging of a capacitor is dispensed with. As a result, power consumption is reduced and the gate of the first FET can be driven at a high speed because there is no delay due to charging and discharging of a capacitor.

In addition, according to the present invention, since the second, third and fourth resistors are further provided, a potential necessary for the gate of the first FET to be driven can be generated by those resistors.

DETAILED DESCRIPTION OF PREFERRED EMBODIMENTS

An embodiment of the present invention will be described in detail in reference to drawings.

Figure 1:
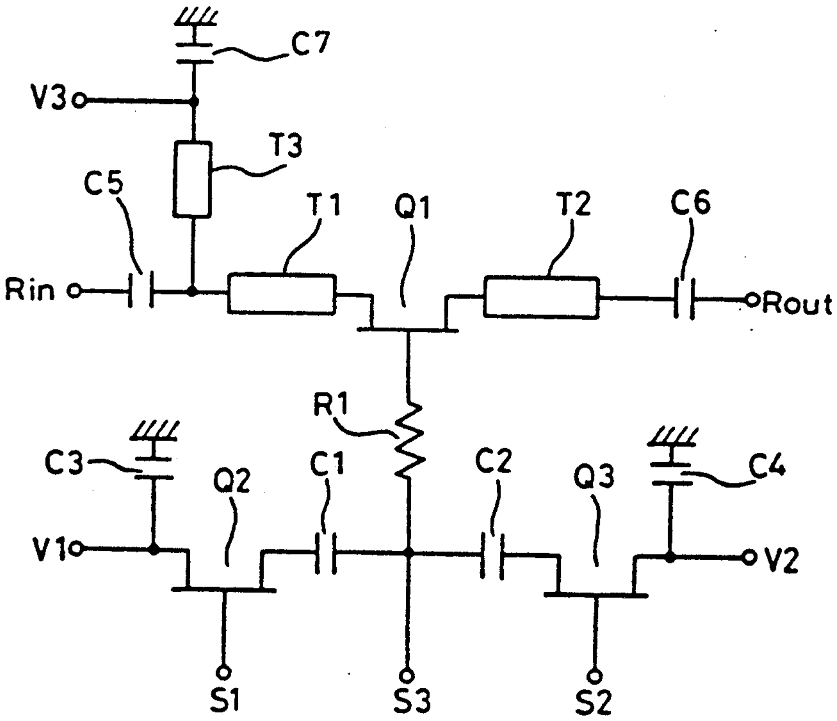
FIG. 1 is a diagram showing a semiconductor integrated circuit in accordance with a first embodiment of the present invention.

FIG. 1 shows a semiconductor integrated circuit in accordance with a first embodiment of the present invention. In FIG. 1, reference numeral Q1 designates a first FET for controlling transfer of a high frequency signal, and reference numerals T1 and T2 designate microwave lines connected to a source and a drain of the FETQ1, respectively. Reference numerals C5 and C6 designate DC blocking capacitors, references Rin and Rout designate microwave input/output terminals through which a high frequency signal such as a microwave signal is input or output, and reference numeral T3 designates a ¼ wavelength line, part of a source bias circuit of the FETQ1. Reference numeral C7 designates a capacitor for grounding the high frequency signal, and is part of the source bias circuit of the FETQ1 together with the microwave line T3, reference numeral V3 designates a power supply terminal for a source bias voltage for the FETQ1, and reference numerals C1 and C2 designate first and second capacitors connected to a gate of the FETQ1 through a resistor R1, respectively. Reference numeral Q2 designates a second FET having its drain connected to the capacitor C1 and its source grounded through the capacitor C3, reference numeral Q3 designates a third FET having its drain connected to the capacitor C2 and its source grounded through the capacitor C4, and reference numerals S1 and S2 designate drive signal input terminals connected to the gates of the second and third FETs Q2 and Q3, respectively. Reference numeral S3 designates a drive signal input terminal connected to the connection of the first and second capacitors C1 and C2 and the resistor R1, reference numerals V1 and V2 designate power supply terminals for supplying a source bias to the second and third FETs Q2 and Q3, respectively.

Then, operation thereof will be described.

Figure 2:
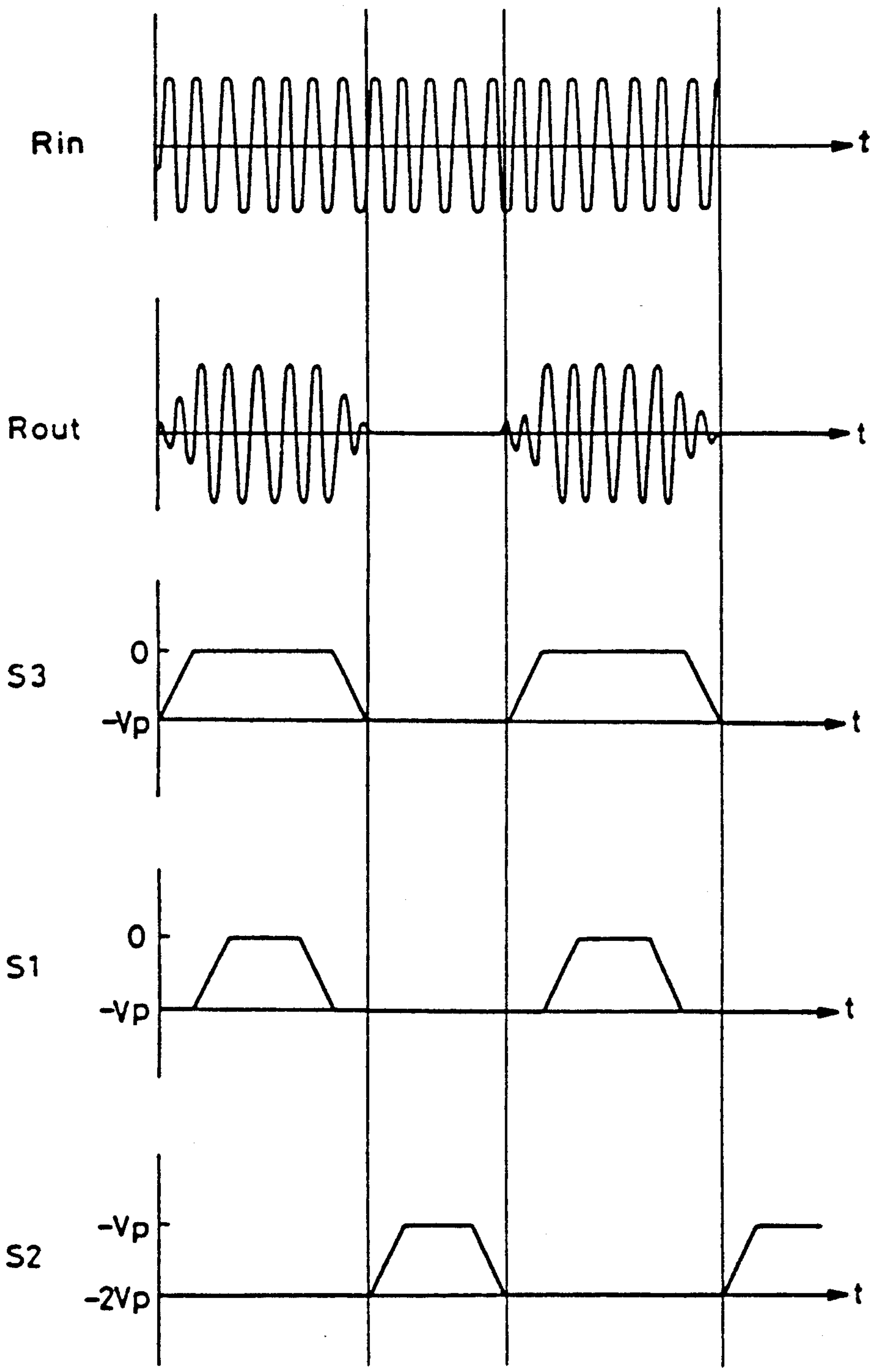
FIG. 2 is a diagram showing an input voltage waveform to each terminal of the semiconductor integrated circuit shown in FIG. 1.

FIG. 2 shows an example of an input waveform of a drive signal applied to each of the drive signal input terminals S1 to S3 with time shown on the abscissa.

It is assumed that a power supply terminal V3 is grounded (0 V) in a DC manner, the source potential of the FETQ1 is 0 V and the pinch off (cut-off) voltage of the FETQ1 is Vp. In addition, it is assumed that the FET is a normally ON type and when a voltage of −Vp is applied between the gate and source thereof, the FET is turned OFF.

At this time, as shown in FIG. 2, if the drive signal input to the terminal S3 is set at 0 v at high level and −Vp at low level, the FETQ1 switches ON/OFF so that the output waveform shown in FIG. 2 is obtained from the microwave output terminal Rout in response to the switching operation of the FETQ1.

Then, a potential of the power supply terminal V1 is set at 0 V and a signal is input from the terminal S1, which signal rises, reaches 0 v and falls to Vp while the input voltage of the terminal S3 is 0 v, and is −Vp while the input voltage at the terminal S3 is −Vp as shown in FIG. 2. Only when 0 V is input to the terminal S1 and the terminal S3 and the terminal V1 are at the same potential of 0 v, the FETQ2 is turned ON. In this ON state is an electric charge amount $Q_{c1}$, which corresponds to a potential difference $V_{c1}$ between the terminals S3 and V1, is stored in the capacitor C1. More specifically, if the capacitance of the capacitor C1 is $C_{c1}$, the electric charge amount $Q_{c1}$ is as follows:

$$V_{c1} \times C_{c1} = Q_{c1}$$

In this embodiment, if there is no voltage fall at the FETQ2, the voltage $V_{c1}$ across the capacitor C1 will always 0 V.

In addition, when the input voltage of the terminal S1 becomes −Vp, the FETQ2 is turned OFF, so that the electric charge amount $Q_{c1}$ is stored in the capacitor C1. As a result, potential across the capacitor C1 is always kept at a constant value.

When the input voltages at the terminals S1 and S3 become 0 V again, the FETQ2 is turned ON as described above, but storage of electric charge does not happen because the electric charge amount $Q_{c1}$ is already stored in the capacitor C1 and both ends of the capacitor C1 are at the same potential.

Then, the potential of the power supply terminal V2 is set at −Vp and a signal is input at the terminal S2 which rises, reaches −Vp and falls while the input voltage of the terminal S3 is −Vp and is −2 Vp while the input voltage of the terminal S3 is 0 V as shown in FIG. 2. Thus, only when the terminal S3 and the terminal V2 are at the same potential of −Vp is the FETQ3 is turned ON. Therefore, at this time, the electric charge amount $Q_{c2}$, which corresponds to a potential difference between the terminals S3 and V2, is stored in the capacitor C2. In this embodiment, if there is no voltage fall at the FETQ3, a voltage across the capacitor is 0 V.

When the input voltage of the terminal S2 becomes −2 Vp, the FETQ3 is turned OFF, so that the electric charge amount $Q_{c2}$ is stored in the capacitor C2. As a result, both ends of the capacitor C2 are always kept at a constant value. Then, when the input potential of the terminal S2 becomes −Vp again, the FETQ3 is turned ON. However, since the electric charge amount $Q_{c2}$ is already stored in the capacitor C2, both ends of the capacitor C2 are at the same potential, so that additional electric charge into the capacitor C2 does not occur.

Figure 4:
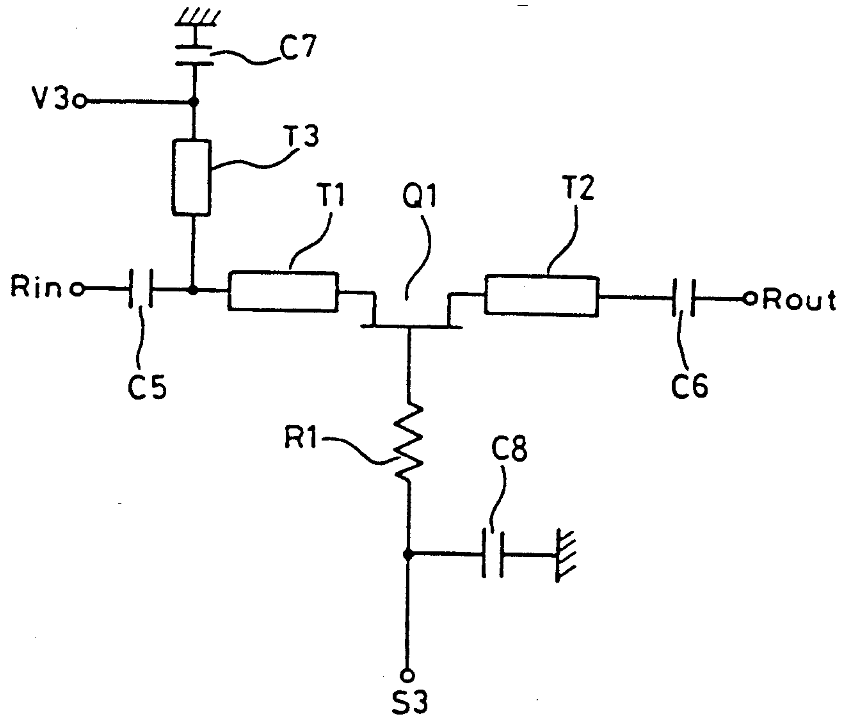
F I G .4. (PRIOR ART)
FIG. 4 is a diagram showing a conventional semiconductor integrated circuit.

Therefore, since either FETQ2 or FETQ3 can be turned ON except when the input voltage of the terminal S3 rises or falls, the gate of the FETQ1 can always grounded (except when it rises or falls) at high frequencies by the capacitor C1 or C2 through the resistor R1. As a result, the same effect as in the conventional circuit shown in FIG. 4 can be obtained.

In addition, as described above, the capacitors C1 and C2 are electrically floating due to the FETs Q2 and Q3, respectively, in accordance with ON or OFF state of the FETQ1 i.e. they are electrically insulated so that an electric charge cannot flow into them. Therefore, voltages across the capacitors C1 and C2 can be always constant (0 V in this embodiment). As a result, power consumption can be reduced because charging or discharging of the capacitor can be dispensed with. In addition, there is no delay time due to charging or discharging of the capacitor, whereby the FETQ1 can be driven at high speed.

As described above, a switching circuit with high performance at high frequencies can be implemented by using the thus constructed semiconductor integrated circuit. In addition, the FETQ1 can be used as an attenuator or an amplifier when it is partially turned ON or OFF in. Furthermore, it can be used as a gate grounded type impedance converter by connecting a bias circuit to the drain of the FETQ1.

Figure 3:
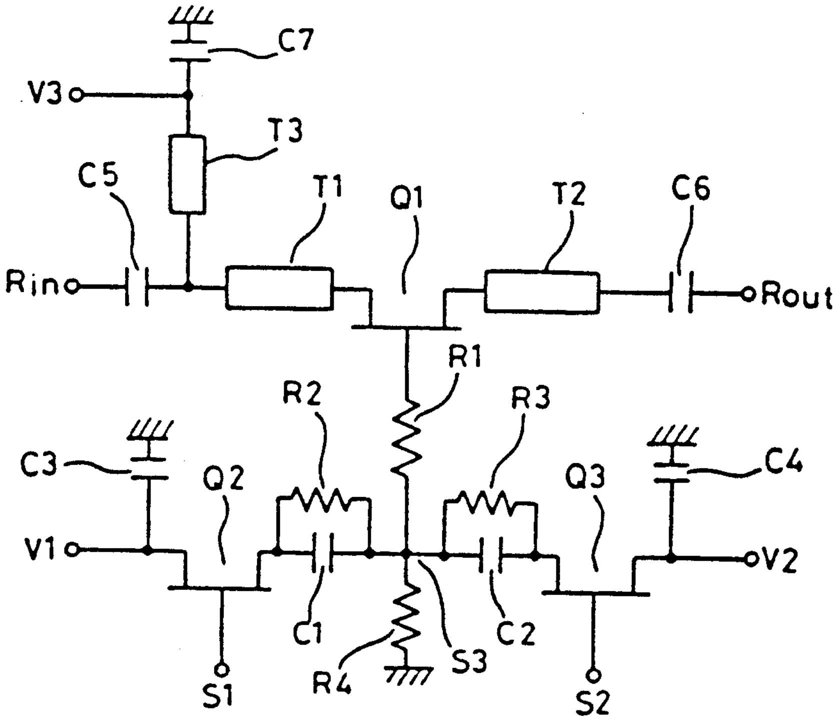
FIG. 3 is a diagram showing a semiconductor integrated circuit in accordance with a second embodiment of the present invention.

FIG. 3 shows a semiconductor integrated circuit in accordance with a second embodiment of the present invention. In FIG. 2, the same reference numbers as in FIG. 1 designate the same part. Reference numerals R2 and R3 designate second and third resistors connected in parallel with the first capacitor C1 and the second capacitor C2, respectively. Reference numeral R4 designates a fourth resistor grounding the connection of the first and second capacitors C1 and C2 and the resistor R1.

Then, operation thereof will be described.

When a signal voltage shown in FIG. 2 is input to the drive signal input terminals S1 and S2, potential of a node S3 is determined the values of the resistors R2 and R4 when the FETQ2 is ON. When the potential of the power supply terminal V1 is 0 V, the potential of the terminal S3 is 0 V.

When the FETQ2 is OFF, the potential of the node S3 is determined by the values of the resistors R3 and R4. For example, when the potential of the power supply terminal V2 is −Vp, the potential of the terminal S3 is as follows;

$$-Vp \cdot R4/(R3+R4)$$

If the value of the resistor R4 is considerably larger than that of the resistor R3, the potential of the terminal S3 can be almost equal to −Vp.

Therefore, an input signal necessary for the node S3 can be composed from the input signal to the drive signal input terminals S1 and S2.

Although the connecting point between the capacitors C1 and C2 and the resistor R1 is grounded through the resistor R4 in the above embodiment, this is not necessarily a grounding potential and may be a fixed potential determined by correlation between the input voltages to the terminals S1, S2, V1, V2 and V3.

In addition, although the resistor R1 is provided so that the impedance may be considerably higher than the line impedance of the microwave lines T1 and T2 in the above embodiment, the resistor R1 can be dispensed with and replaced with a direct connection if a sufficiently high impedance can be obtained. In addition, instead of the resistor, a ¼ wavelength line, or a resistor and a ¼ wavelength line which are connected in series, may be provided.

Although the normally ON type FET is used in the above embodiment, the same effect can be obtained even when a normally OFF type FET is used.

In addition, in the above embodiment, as shown in FIG. 2, the input signal to the terminal S1 rises, reaches 0 V and falls while the input voltage of the terminal S3 is 0 V and is −Vp while the input voltage of the terminal S3 is −Vp. Furthermore, the input signal to the terminal S2 rises, reaches −Vp and falls while the input voltage of the terminal S3 is −Vp and it is −2 Vp while the input voltage of the terminal S3 is 0 V. However, the input signal to the terminal S1 may be 0 v while the input voltage of the terminal S3 is 0 V and −Vp while the input voltage of the terminal S3 is Vp and the input signal to the terminal S2 may be −Vp while the input voltage of the terminal S3 is −Vp and −2 Vp while the input voltage of the terminal S3 is 0 V. In this case, the gate of the FETQ1 can be always grounded by either capacitor C1 or C2 at high frequencies through the resistor R1 even when the input voltage rises or falls.

In addition, although the potentials of the power supply terminals V1, V2 and V3 are set at 0 V, −Vp and 0 V, respectively, in the above embodiments, these can be set at any value if the FETs Q1, Q2 and Q3 operate.

Although a description is given of the microwave circuit using microwave line in the above embodiments, the same effect can be obtained if the FETQ1 serves as a transfer gate for controlling transfer of a high frequency signal even without the transmission lines T1 to T3 and capacitors C1 to C7.

As described above, a semiconductor integrated circuit in accordance with the present invention comprises a first FET serving as a transfer gate controlling transfer of a high frequency signal, first and second capacitors connected to a gate of the first FET directly or through a resistor or a ¼ wavelength line, a second FET having its drain connected to the first capacitor and its source grounded at high frequencies and a third FET having its drain connected to the second capacitor and its source grounded at high frequencies. Therefore, the first and second capacitors can be electrically in floating though the second and third FETs, respectively, in accordance with ON or OFF state of the first FET. As a result, power consumption is reduced and there is no delay time because charging or discharging of the capacitor can be dispensed with, whereby the first FET can be driven at high speed.

Furthermore, a semiconductor integrated circuit in accordance with the present invention comprises a second resistor connected in parrallel with the first capacitor, a third resistor connected in parrallel with the second capacitor, a fourth resistor having one end connected to the connection between the second resistor and the third resistor and the other end fixed to a certain potential. Therefore, in addition to the above effect, there is provided a high frequency semiconductor integrated circuit with high performance in which a potential required when the first FET is driven can be provided through these resistors and a signal necessary for gate driving can be easily provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:

a first FET having a gate, a source, and a drain for controlling transfer of a high frequency signal;

first and second capacitors, each having first and second terminals, the first terminals of the first and second capacitors being connected to the gate of said first FET;

a second FET having a gate, a source, and a drain, the drain of said second FET being connected to the second terminal of said first capacitor, the source of said second FET being grounded at high frequencies, and the gate of the second FET receiving a first drive signal; and a third FET having a gate, a source, and a drain, the drain of said third FET being connected to the second terminal of said second capacitor, the source of said third FET being grounded at high frequencies, and the gate of the third FET receiving a second drive signal.

2. A semiconductor integrated circuit in accordance with claim 1 comprising:

a first resistor connected in parallel with said first capacitor;

a second resistor connected in parallel with said second capacitor; and a third resistor having first and second terminals, the first terminal of said third resistor being connected to the first terminals of said first and second capacitors and the second terminal of said third resistor being connected to a fixed potential.

3. A semiconductor integrated circuit in accordance with claim 1 wherein said first FET comprises one of a normally ON type FET and normally OFF type FET.

4. A semiconductor integrated circuit in accordance with claim 1 including input and output terminals and input and output microwave transmission lines wherein the source of said first FET is connected to the output terminal through said first microwave transmission line and the drain of said first FET is connected to the input terminal through said second microwave transmission line.

5. A semiconductor integrated circuit in accordance with claim 4 comprising first and second DC blocking capacitors respectively connected between said first microwave transmission line and the output terminal and said second microwave transmission line and the input terminal.

6. A semiconductor integrated circuit in accordance with claim 4 including a source bias circuit connected to the source terminal of said first FET.

* * * * *